(12) United States Patent
Hayano

(10) Patent No.: US 7,362,436 B2
(45) Date of Patent: *Apr. 22, 2008

(54) METHOD AND APPARATUS FOR MEASURING OPTICAL OVERLAY DEVIATION

(75) Inventor: Fujimori Hayano, Phoenix, AZ (US)

(73) Assignee: Nikon Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/785,003

(22) Filed: Apr. 13, 2007

(65) Prior Publication Data

US 2007/0195325 A1 Aug. 23, 2007

Related U.S. Application Data

(63) Continuation of application No. 10/760,586, filed on Jan. 21, 2004, now Pat. No. 7,218,399.

(51) Int. Cl.
*G01B 11/00* (2006.01)

(52) U.S. Cl. ...................................... 356/401

(58) Field of Classification Search ........ 356/399–401, 356/237.1, 237.4
See application file for complete search history.

(56) References Cited

U.S. PATENT DOCUMENTS

| | | | | |
|---|---|---|---|---|
| 5,766,809 A | * | 6/1998 | Bae | 430/22 |
| 6,563,573 B1 | * | 5/2003 | Morohoshi et al. | 356/124 |
| 6,639,677 B1 | * | 10/2003 | Ina et al. | 356/401 |
| 6,885,450 B2 | * | 4/2005 | Fukui | 356/401 |
| 6,975,399 B2 | * | 12/2005 | Fukui | 356/401 |
| 2002/0027648 A1 | * | 3/2002 | Van Der Laan et al. | 355/71 |
| 2002/0060793 A1 | * | 5/2002 | Fukui | 356/400 |

* cited by examiner

*Primary Examiner*—Tarifur Chowdhury
*Assistant Examiner*—Isiaka O Akanbi
(74) *Attorney, Agent, or Firm*—Oliff & Berridge, PLC

(57) ABSTRACT

An apparatus and method analyze overlay deviation in alignment between a first mark and a second mark that are formed on a substrate. In particular, a relationship between changes in overlay deviation values and changes in focus position of the substrate for a plurality of sets of the first and second marks that are provided on the substrate is calculated, and then an output is provided from which a user can determine whether the substrate suffers from wafer-induced-shift. Preferably, the output is a vector-map showing the relationship between changes in overlay deviation values and changes in focus position of the substrate for the plurality of sets of marks.

10 Claims, 9 Drawing Sheets

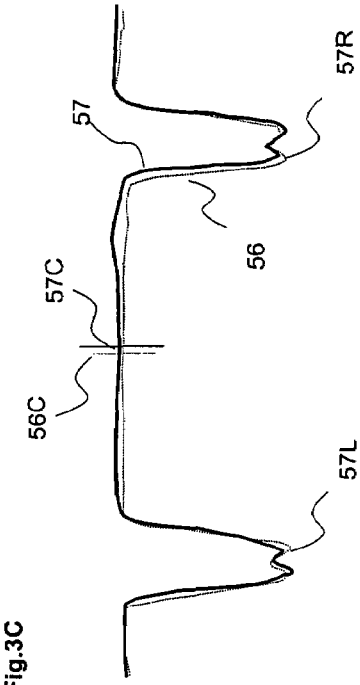
Fig.3B
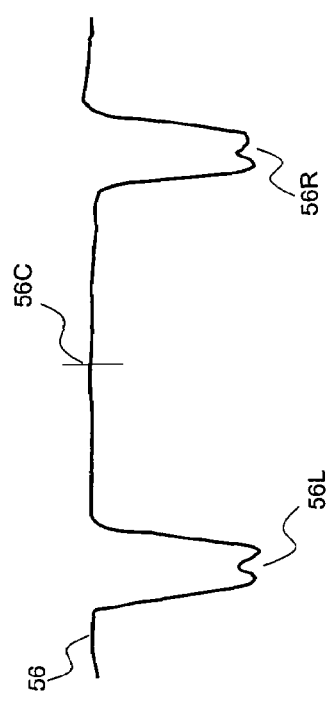
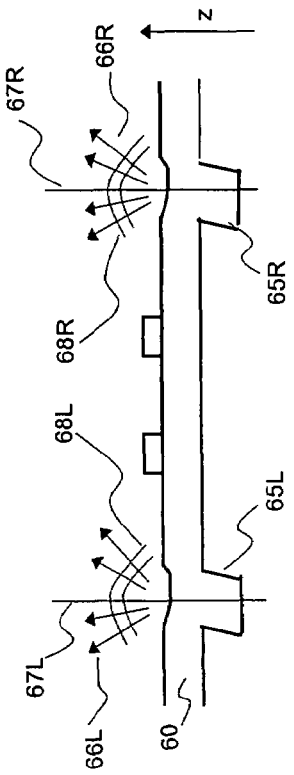
Fig.3C
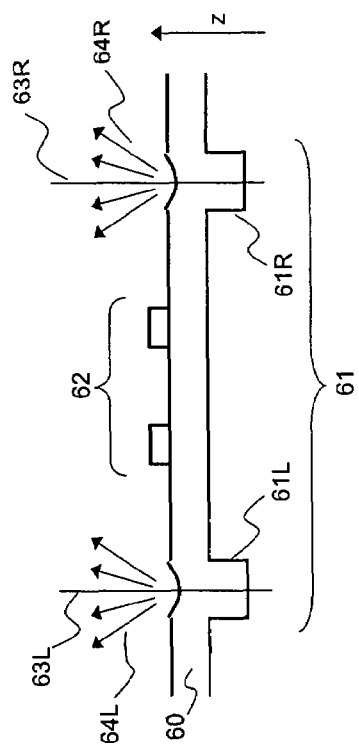

METHOD AND APPARATUS FOR MEASURING OPTICAL OVERLAY DEVIATION

This is a Continuation of application Ser. No. 10/760,586 filed Jan. 21, 2004, the disclosure of which is hereby incorporated by reference herein in its entirety.

BACKGROUND OF THE INVENTION

1. Field of Invention

The present invention relates generally to optical inspection of semiconductor substrates during the production of semiconductor devices. In particular, the present invention relates to methods and apparatus for detecting the overlay deviation between two patterned layers on a semiconductor substrate.

2. Description of Related Art

One of the most critical process control techniques used in the manufacturing of integrated circuits is the measurement of overlay accuracy between patterned layers, i.e., the measurement of how accurately a patterned layer aligns with respect to another patterned layer located (directly or indirectly) above or below that layer.

Overlay measurement typically is performed on a patterned resist layer prior to etching that layer. If a substrate contains layers that are out of alignment, then the substrate should be reworked (i.e., the photoresist layer(s) are stripped) and returned to the photolithography process to be exposed again at a corrected alignment. Typically, the overlay error is measured, and then the results of the measurement are fed back into the control system that controls the alignment of layers.

Measurement patterns, formed in each of the patterned layers, are used to measure the overlay deviation. The most commonly used measurement patterns are squares, generally referred to as "bar-in-bar" marks, an example of which is shown in FIG. 2A. An outer bar mark 51 is printed on a process layer (lower layer) with side-to-side dimensions of approximately 30 micrometers, and an inner bar mark 52 is printed 6n a photoresist layer (upper layer) with a side-to-side dimension of approximately 15 micrometers. The outer bar mark 51 and the inner bar mark 52 are detected by a microscope system having a CCD camera, for example.

The overlay deviation of the photoresist layer in terms of the process layer is a positional deviation between the outer bar mark 51 and the inner bar mark 52. Hereafter, the overlay deviation will be referred to as an "overlay-offset." FIG. 2B illustrates a CCD output signal waveform taken along the line 53 shown in FIG. 2A. A signal 54L, a signal 54R, a signal 55L and a signal 55R correspond to the signals emitted from points 51L, 51R, 52L and 52R, respectively. A median point 54C is calculated from the signals 54L and 54R. Similarly, a median point 55C is calculated from the signals 55L and 55R. The overlay-offset in the X-direction is determined by calculating the difference between the median point 54C and the median point 55C. This same method is used to determine the overlay-offset in the Y-direction. A zero overlay-offset at all alignment marks on the substrate (the substrate can be, for example, a silicon wafer, a glass or quartz substrate, or a substrate made from semiconductor materials other than silicon) means that the photoresist layer is exactly aligned with the (underlying) process layer. In this case, the substrate is forwarded to the next manufacturing process without any reworking being done.

However, even if the measured overlay-offset is 0, a displacement error between the two layers may exist. Generally, there are two reasons for this (unmeasured) displacement error. The two reasons are tool induced shift (TIS) and wafer induced shift (WIS), to be explained below.

Tool induced shift is an error in the measurement which is caused by the tool which performs the measurement. The tool includes the CCD, the optical system of the tool (which includes the illumination system for illuminating the substrate and the detection system optics by which the image of the substrate is observed by the CCD), and software that is used to control the system. TIS can be caused, for example, when the illumination light is not telecentric or when an optical axis of the illumination system and/or of the detection optical system is not exactly perpendicular to the substrate. TIS can be calculated by the following equation (1):

$$TIS=(M(0)+M(180))/2 \qquad \text{Equation (1)}$$

in which $M(0)$ is the overlay-offset calculated at a 0° orientation of the alignment mark, and $M(180)$ is the overlay-offset calculated when the substrate is rotated by 180° (known as the 180° orientation of the alignment mark). In FIG. 2A, the sheet surface is defined as an X-Y plane, and an axis perpendicular to the sheet is defined as the Z-axis. The overlay-offset is measured at $\theta=0°$ orientation of the substrate, and then the substrate (including the bar-in-bar mark) is rotated by $\theta=180°$ about the Z-axis so that overlay-offset at $\theta=180°$ can be measured. Thus, $M(0)$ and $M(180)$ can be measured in order to determine TIS. In order to minimize the displacement error, TIS should be compensated. An overall TIS corrected value (referred to as TCV (TIS corrected value)) is used as an overlay-offset value for an evaluation of the alignment. The following equation (2) shows how TCV is calculated:

$$TCV=M(0)-TIS=(M(0)-M(180))/2 \qquad \text{Equation (2)}$$

Wafer induced shift (i.e., errors in the measurement results due to wafer induced shift) occurs due to characteristics of the patterned layers formed on the substrate. One cause of WIS is an asymmetric (non-uniform) processing that is performed on the film layers formed on the substrate. For example, if a step that removes or polishes part of a layer from the substrate, or if a step that deposits a layer onto the substrate, is not performed uniformly over the entire substrate, it may cause WIS. For example, certain layers are made very thin by performing a chemical mechanical planarization (CMP) process on that layer in order to remove a part of the thickness of the layer. This CMP process typically is performed using a rotating disk that is contacted with the uppermost layer on the substrate in order to remove part of that layer. Since the speed of the disk at its outer perimeter is higher than the speed of the disk near its center, different effects can be caused on the substrate layer near the outer perimeter of the disk compared to the inner (center) portion of the disk. For example, the directions of throughholes can be become tilted (in the direction in which the disk rotates) as one progresses from the center of the substrate toward the outer perimeter thereof. In addition, during deposition, typically a source of the deposited material is located above the substrate at the location of the central axis of the substrate. The vaporized particles to be deposited on the substrate are emitted from this point source, and can become deposited unequally between the center and outer perimeter of the substrate. These asymmetric processing steps can cause WIS errors in the measurements made during the overlay measurement process. WIS should be compensated for as well as TIS. However, WIS compensation is very difficult and therefore is not done very frequently, as described below.

Typically substrates are processed in batches (also called "lots") corresponding to the number of substrates that can be held in a cassette. A typical cassette capacity is 25 substrates. Overlay inspection typically is performed on three wafers from each lot. Thus, if a lot includes 25 substrates, the overlay inspection (including TIS evaluation) is conducted on, for example, the first, tenth and twentieth substrates of the lot. However, in order to measure WIS, a process referred to as after etching inspection (AEI) is performed. AEI is time consuming and involves viewing the substrate using, for example, a scanning electron microscope (SEM). AEI, however, damages the circuitry formed on the substrate, such that the measured substrate must be reworked. AEI is not a regular procedure, and therefore typically is conducted once per day or once per week or once per month. It is not practical to perform AEI on each lot of substrates.

Thus, WIS is not regularly evaluated. Solving issues related to WIS is more important than ever because, with increasingly smaller circuit patterns, process control technologies (such as overlay accuracy) become more and more critical. The required precision specification for overlay machines is about 2.5 nm for 70 nm technology node. Currently, the precision of overlay measurement, which defines measurement repeatability, is 1 nm or less for the actual process substrate. The precision performance is sufficient for the current overlay specification requirements. On the other hand, the accuracy performance, i.e., how close the measurement is to a true overlay-offset without WIS compensation, is still over 5-10 nm. Therefore, it is desirable to measure WIS and compensate WIS values for the measured overlay-offset values, in order to improve. Thus, as noted above, WIS is periodically measured and compensated for. It would, however, be desirable to evaluate WIS more frequently without requiring frequent performance of AEI.

SUMMARY OF THE INVENTION

Accordingly, one aspect of the present invention is to provide apparatus and methods that can characterize and monitor WIS in real time in order to improve the overlay measurement accuracy.

According to one aspect of the invention, an apparatus and method for measuring overlay deviation between two layers is capable of evaluating WIS in a simple manner without necessarily requiring AEI. A wafer having alignment marks provided in two layers is placed on a stage device that is movable in X, Y, Z and θ directions. The substrate is provided in the X-Y plane, and the Z-axis is perpendicular to the substrate surface (i.e., the X-Y plane). The apparatus can measure TIS at substrate orientations of 0° and 180°, and calculate TCV for each alignment mark. The apparatus also measures TIS-through-focus (i.e., TIS at different focus positions) by moving the wafer along the Z-axis and calculating TIS at a plurality of Z-axis positions. TCV-through-focus (i.e., TCV values at the different focus positions) can be calculated for each alignment mark using the values obtained for TIS-through-focus. If the layers formed on the substrate suffer from WIS, the TCV values will change at different Z-axis positions (i.e., at different focus positions) of the substrate. The present invention, thus, can display a vector map of the TCV-through-focus values so that an observer of the vector map can determine whether the wafer suffers from WIS.

By monitoring (observing) the WIS characteristics of a wafer from each lot, one can readily observe whether the WIS characteristics of the wafers have changed. Thus, while the invention does not necessarily measure the WIS values, it enables one to monitor the WIS characteristics of wafers using existing components of the overlay measurement machine (i.e., components that are used to measure TIS). If the WIS characteristics change (for example, if the size of the vectors on the displayed vector-map change, for example, by increasing in length), then AEI can be performed in order to measure the WIS values and then compensate for the changes in WIS.

According to one embodiment, the apparatus calculates d/dz TCV (differentiated TCV by z), and then plots the d/dz TCV vector for each alignment mark on a two dimensional map. The d/dz TCV vector is defined by two directional components, X and Y. The d/dz TCV vector-map that is displayed reflects WIS, e.g., if the d/dz TCV vector-map shows rotational direction, then the substrate can be characterized as suffering from rotational WIS. By comparing the d/dz TCV vector-map with a d/dz TIS vector-map, the apparatus and method can distinguish TIS from WIS. For example, when both the d/dz TIS vector-map and the d/dz TCV vector-map show a similar directional component, the wafer can be deemed to not suffer from WIS. However, when the d/dz TIS vector-map shows a directional component and the d/dz TCV vector-map shows a magnification component, the wafer can be deemed to suffer from magnification WIS.

Another aspect of the invention relates to a method for monitoring fluctuation in WIS. Many processes need to be controlled in order to stably manufacture semiconductor devices. For example, the film stack thickness, deposition conditions, chemical mechanical planarization (CMP) conditions, etc., need to be controlled. However, unexpected changes can occur, for example, a wafer can be over CMP polished, or an efficiency of deposition can be reduced due to shrinkage (depletion) of a source of the deposited material over the vaporization-life of the material. WIS is periodically measured and compensated for to improve accuracy. Thus, such unexpected changes can be detected. If, on the other hand, such unexpected changes are not detected, the same compensation values will continue to be used up until the next WIS evaluation period, and therefore, an over-WIS-compensation or an under-WIS-compensation would occur. This leads to serious mis-alignment errors, which are out of the overlay budget. As noted above, the apparatus can monitor the lot-by-lot fluctuation of WIS by measuring d/dz TCV and d/dz TIS for each lot of wafers. Thus the period of time is reduced in which unexpected WIS changes remain uncompensated.

Thus, an apparatus and method of the invention analyze overlay deviation in alignment between a first mark and a second mark that are formed on a substrate. In particular, a relationship between changes in overlay deviation values and changes in focus position of the substrate for a plurality of sets of the first and second marks that are provided on the substrate is calculated, and then an output is provided from which a user can determine whether the substrate suffers from wafer-induced-shift. Preferably, the output is a vector-map showing the relationship between changes in overlay deviation values and changes in focus position of the substrate for the plurality of sets of marks.

BRIEF DESCRIPTION OF THE DRAWINGS

The invention will be described with reference to the following drawings in which like reference numerals designate like parts, and wherein:

FIG. 3B is a cross-sectional view and a signal waveform graph for an ideal alignment mark;

FIG. 3C is a cross-sectional view and a signal waveform graph for an alignment mark suffering from WIS;

DETAILED DESCRIPTION OF PREFERRED EMBODIMENTS

A preferred exemplary embodiment of the invention will be described with reference to the drawings.

Figure 1:
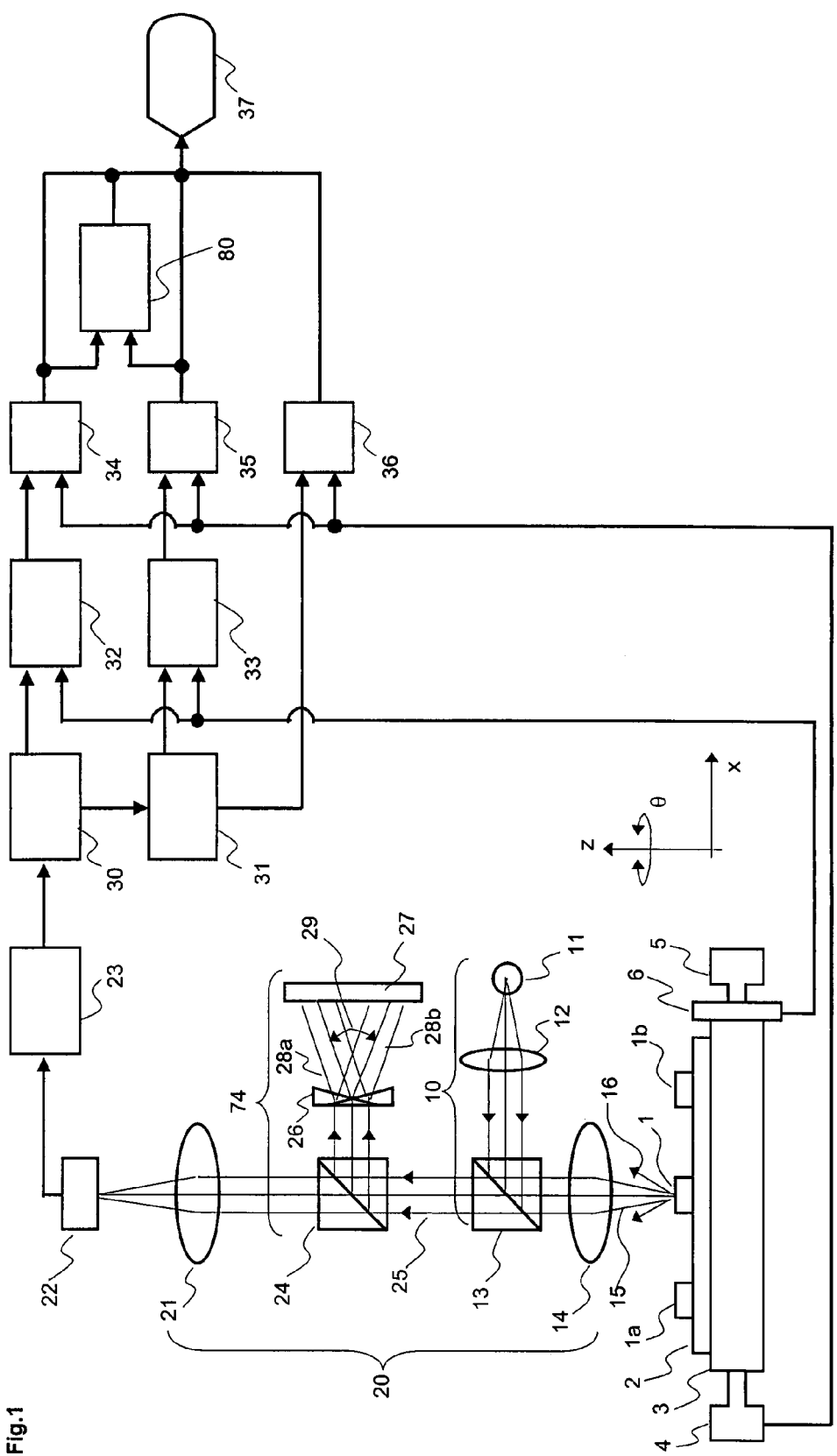
FIG. 1 schematically shows a construction of an optical overlay deviation measuring apparatus according to one embodiment of the invention.

FIG. 1 shows one example of an apparatus for measuring an overlay-offset according to the present invention. A direction perpendicular to the sheet surface is set as the Y-axis direction, directions extending to the right and left are set as the X-axis direction, and directions extending up and down are set as the Z-axis directions. Rotation about the Z-axis is set as θ in FIG. 1.

The measuring apparatus measures overlay-offset, i.e., a positional deviation in alignment of an alignment mark 1 formed on a substrate such as wafer 2. As is known, there are many alignment marks 1a and 1b on the wafer 2. The wafer 2 is placed on a stage 3 during measurement of the overlay-offset. The stage 3 is movable in X and Y-directions, and is rotatable in the θ direction (i.e., about the Z-axis). Thus, overlay-offset can be measured for a wafer at a 0° orientation and at a 180° orientation.

An X-Y position-measuring device 4 measures the X-Y coordinates of the alignment mark 1, in the usual manner.

The stage 3 also is movable up and down (i.e., movable along the Z-axis direction) by a focus-moving device 5. The focus-moving device 5 includes a linear scale 6 to measure the position of the wafer 2 in the Z-axis direction. The focus-moving device 5 can move the stage 3 with 0.01 μm accuracy over a range of 6 μm (i.e., +3 μm from a zero-position and −3 μm from the zero-position).

The apparatus includes an illumination optical system 10 that includes a light source 11 (e.g., a halogen light source), a condenser lens 12 and a half prism 13. The collimated illumination beam is incident upon the half prism 13, and the light reflected by the half prism 13 exits downward and is converged by an objective lens 14. The converged illumination beam 15 falls vertically upon the alignment mark 1 disposed on the wafer 2.

The apparatus also includes an image-forming optical system 20 that includes the objective lens 14 and an image-forming lens 21. A reflected beam 16 is led via the image-forming optical system 20 to an imaging device 22 (e.g., a CCD camera). The reflected beam 16 is collimated into a parallel beam by the objective lens 14 and, after passing through the half prism 13, is converged by the image-forming lens 21 onto the imaging device 22.

Figure 2A:
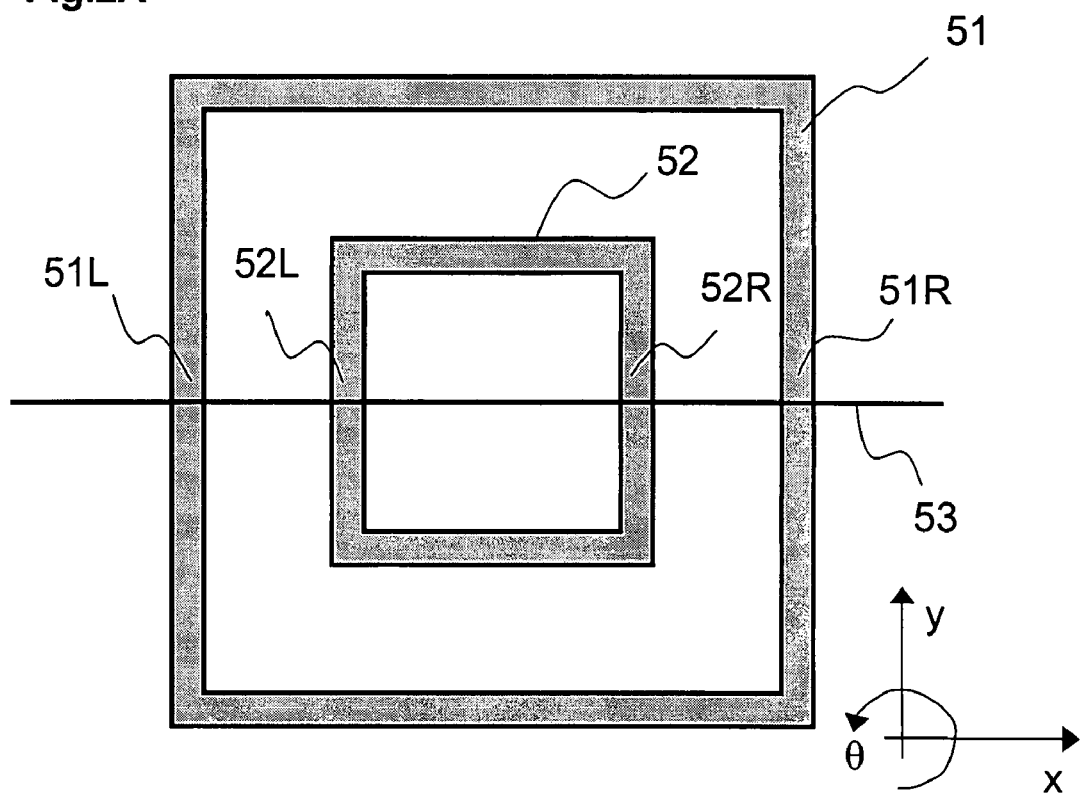
FIG. 2A is a plan view showing an alignment mark.
Figure 2B:
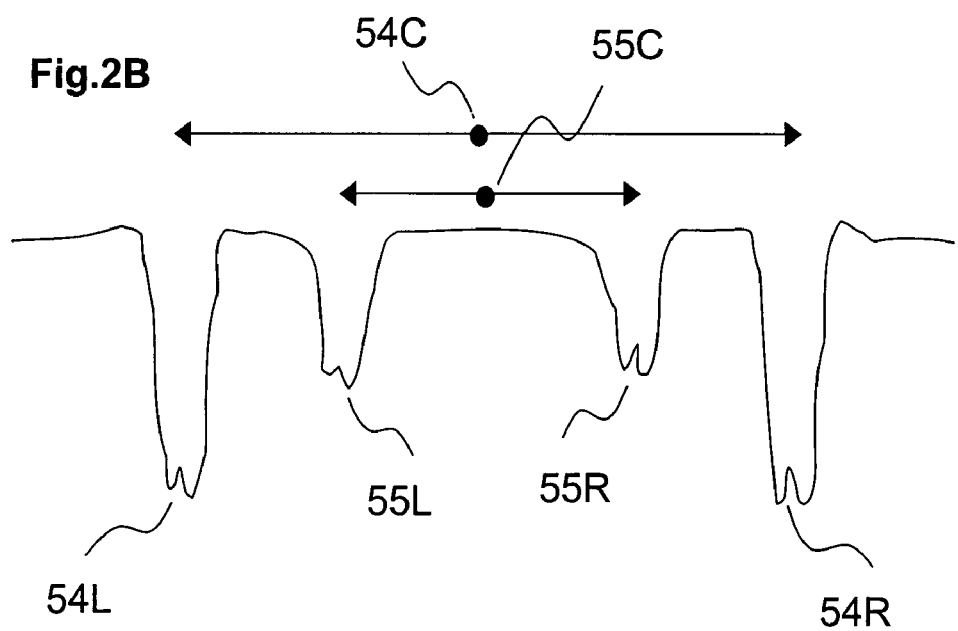
FIG. 2B is a graph showing the signal waveform output by the imaging device (e.g., a CCD) of the optical overlay deviation measuring apparatus.

An image-processing device 23 calculates the median point 54C and the median point 55C illustrated in FIG. 2B, and then calculates the overlay-offset in the X-direction. A similar method is used to calculate the overlay-offset in the Y-direction. A half prism 24 is located between the half prism 13 and the image-forming lens 21 to separate a reflected beam 25 that exits the half prism 13. An automatic focusing unit 74 includes the half prism 24, a dual-wedge prism 26 and a linear CCD 27. A beam passed through the dual-wedge prism 26 is separated into two beams 28a and 28b. When the focus-moving device 5 moves the stage 3 up or down, the parallelism of the reflected beam 25 changes and an angle 29 between the beams 28a and 28b becomes smaller or larger (narrower or wider) respectively. The linear CCD 27 measures the distance from the beam 28a to the beam 28b, and fixes an optimum Z-position as a zero-position (hereafter, the zero-position is referred to as AF=0 position).

In order to calculate TIS, the apparatus measures the overlay-offset of the alignment mark 1 at θ=0° orientation of the wafer 2, and then rotates the wafer 2 using the stage 3 to put the wafer at the θ=180° orientation, and then measures the overlay-offset of the alignment mark 1 at θ=180°. TIS and TCV in the X-direction are calculated using the overlay-offset value M(0) at 0° X-direction and the overlay offset value M(180) at the 180° X-direction orientations using equations (1) and (2), respectively. TIS and TCD in the Y-direction are obtained by a similar procedure.

Figure 3A:
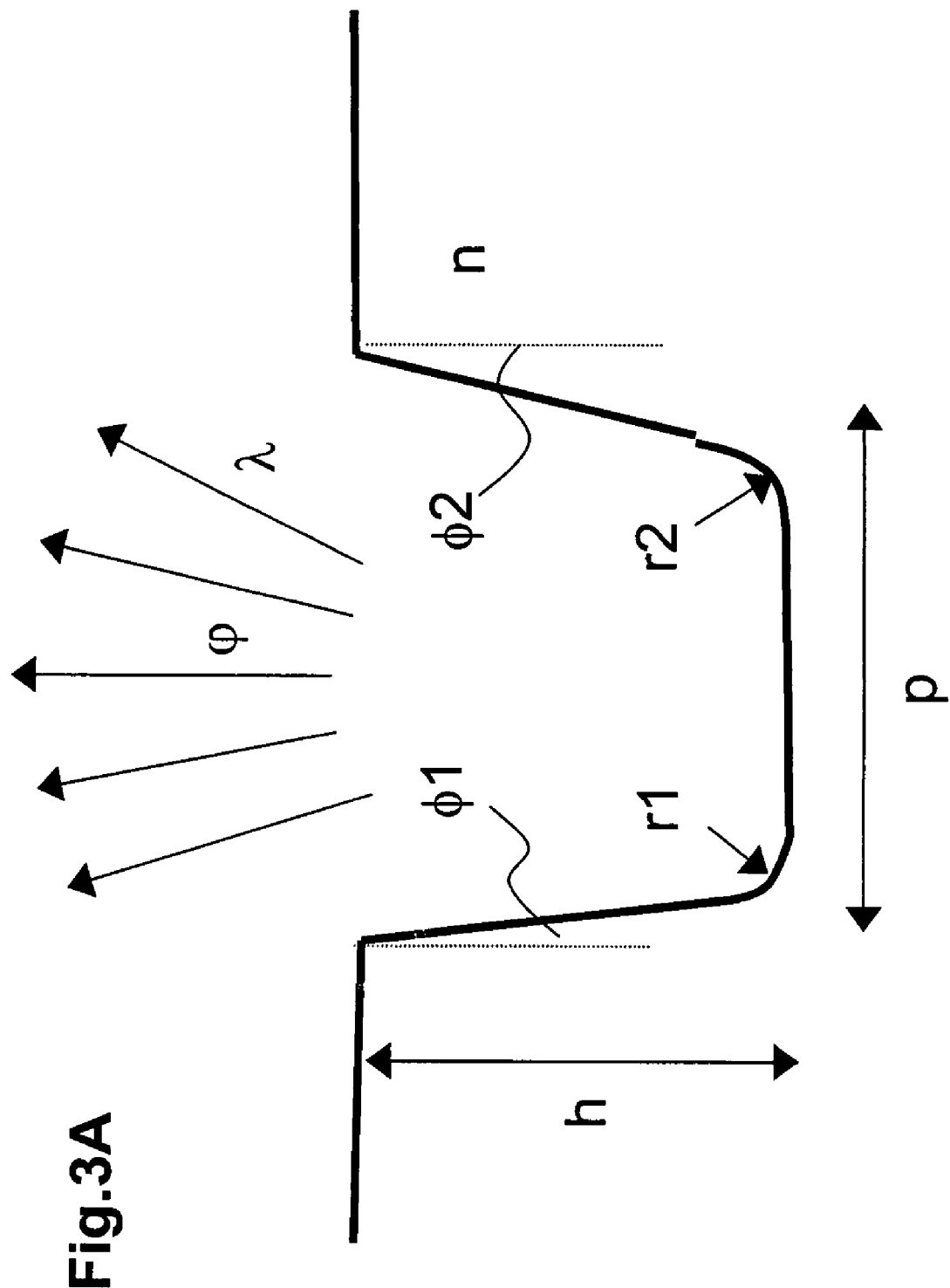
FIG. 3A is a cross-sectional view showing the diffraction light emitted from an alignment mark.

FIG. 3A is a cross-sectional view of a substrate layer, and shows an alignment mark. In general, the diffraction light emitted from the alignment mark is affected by various parameters such as, for example, the wavelength λ of the light, the refractive index n of the material, the diffraction angle □, the step-height h of the mark, the width p of the mark, the tapered angles φ1 and φ2 of the mark, and the roundness r1 and r2 of the bottom edges of the mark. The diffraction light is collimated by the objective lens 14, and imaged onto the imaging device 22.

FIG. 3B illustrates a cross section on the line 53 (shown in FIG. 2A) and a CCD output signal waveform 56. An outer mark 61 is placed in a process layer 60 (polysilicon, aluminum, etc.) and an inner mark 62 (photoresist layer) is placed onto the process layer 60. Ideally, both a left side outer mark 61L and a right side outer mark 61R are symmetric with respect to a perpendicular line 63L and 63R, so that a diffraction light 64L and a diffraction light 64R are symmetric with respect to the perpendicular lines 63L and 63R. Therefore, the overlay-offset can be measured accurately, and does not contain any WIS. Also, a median point 56C (calculated from the signals 56L and 56R) does not change when the focus-moving device 5 moves the wafer up or down along the Z-axis. That is, the overlay-offset is stable through-focus.

In an actual case, however, for example after CMP processing, the cross-sectional shape becomes tilted as shown in FIG. 3C. A diffraction light 66L emitted from a tilted mark 65L and a diffraction light 66R emitted from a tilted mark 65R are asymmetric with respect to the perpendicular lines 67L and 67R. In addition, a wavefront 68L of the diffraction light 66L, and a wavefront 68R of the diffraction light 66R are eccentric. Therefore, a signal 57L and a signal 57R of the CCD output signal waveform 57 shift from the ideal signal positions 56L and 56R (the ideal waveform is shown by the dotted line in FIG. 3C). Accordingly, a median point 57C shifts from the ideal median point 56C, i.e., the overlay-offset cannot be measured with high accuracy due to WIS. In addition, the median point 57C changes when the focus-moving device 5 moves the wafer 2 up or down along the Z-axis. That is, the overlay-offset is not stable through-focus.

Figure 4B:
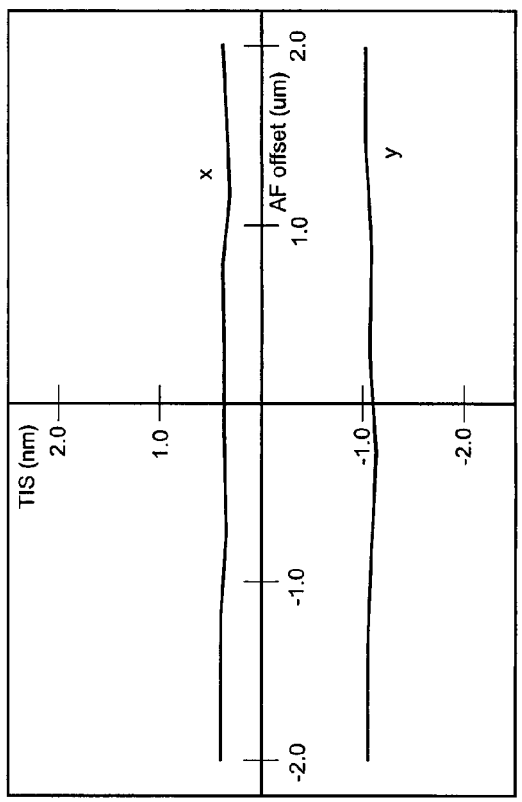
FIG. 4B is a graph showing TIS-through-focus.
Figure 4A:
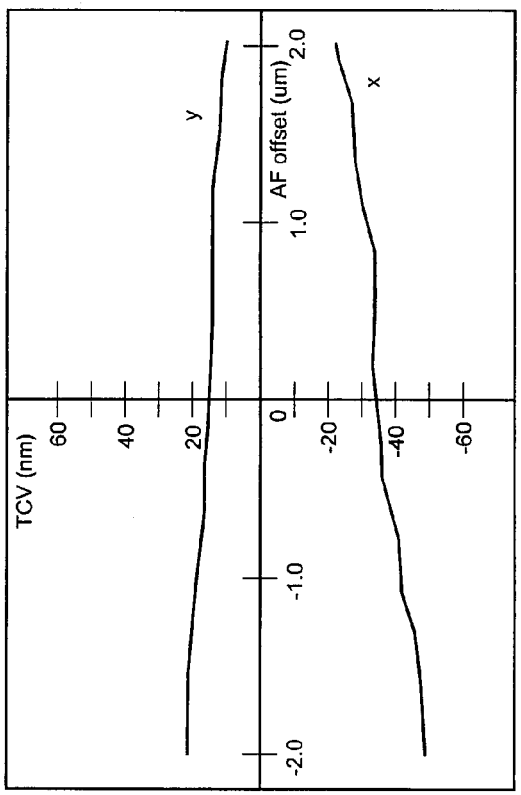
FIG. 4A is a graph showing TCV-through-focus.

FIG. 4A shows the TCV-through-focus data for one alignment mark. In FIG. 4A, the horizontal axis shows a focusing position (the value 0 is the AF=0 position), and the vertical axis shows TCV. FIG. 4B shows the TIS-through-focus data. Comparing FIG. 4A with FIG. 4B, TCV changes through-focus, although TIS appears to be stable through-focus. Therefore, this wafer is characterized to suffer from WIS.

The invention makes use of this observation that a variation of the TCV-through-focus reflects the existence of WIS. The invention also can observe variations of the TCV-through-focus depending on the location of the alignment mark on the substrate. This is due to the fact that CMP and the deposition techniques can vary over the wafer, thereby causing WIS.

According to the invention, it is possible to analyze a vector-map of TCV-through-focus. In order to analyze the vector-map of TCV-through-focus d/dz TCV is determined and evaluated. The d/dz TCV is a differential value of TCV over changes in the focus position Z, and is provided by the following equation (3):

$$d/dzTCV = (TCV(z2) - TCV(z1))/(z2 - z1) \quad \text{Equation (3)}$$

in which TCV (z1) and TCV (z2) are the values of TCV at z=z1 and TCV at z=z2, respectively. The d/dz TCV vector is defined by the following four values: d/dz TCV in the X-direction, d/dz TCV in the Y-direction, and coordinate values x and y. The d/dz TCV vector-map can be determined and drawn/displayed for a number of alignment mark locations on the substrate.

Referring back to FIG. 1, which shows an exemplary embodiment of the invention, the overlay-offset values calculated by the image processing device 23 are input to a TIS calculation device 30. The TIS calculation device 30 calculates TIS values for both the X- and Y-directions using equation (1) discussed above. A TCV calculation device (an overlay calculation device) 31 calculates TCV values for both the X- and Y-directions using equation (2) described above.

Then, a d/dz TIS calculation device (TIS-through-focus calculation device) 32 calculates a value of TIS differentiated over Z (i.e., change in TIS with change in focus position), based on the TIS information and the Z-positional information obtained from the linear scale 6 for different Z-positions. A d/dz TCV calculation device (an overlay-through-focus calculation device) 33 calculates a value of TCV differentiated over Z (i.e., a change in TCV with changes in the focus position), using equation (3), described above, based on the TCV information and the Z-positional information obtained from the linear scale 6 for different Z-positions.

Figure 5A:
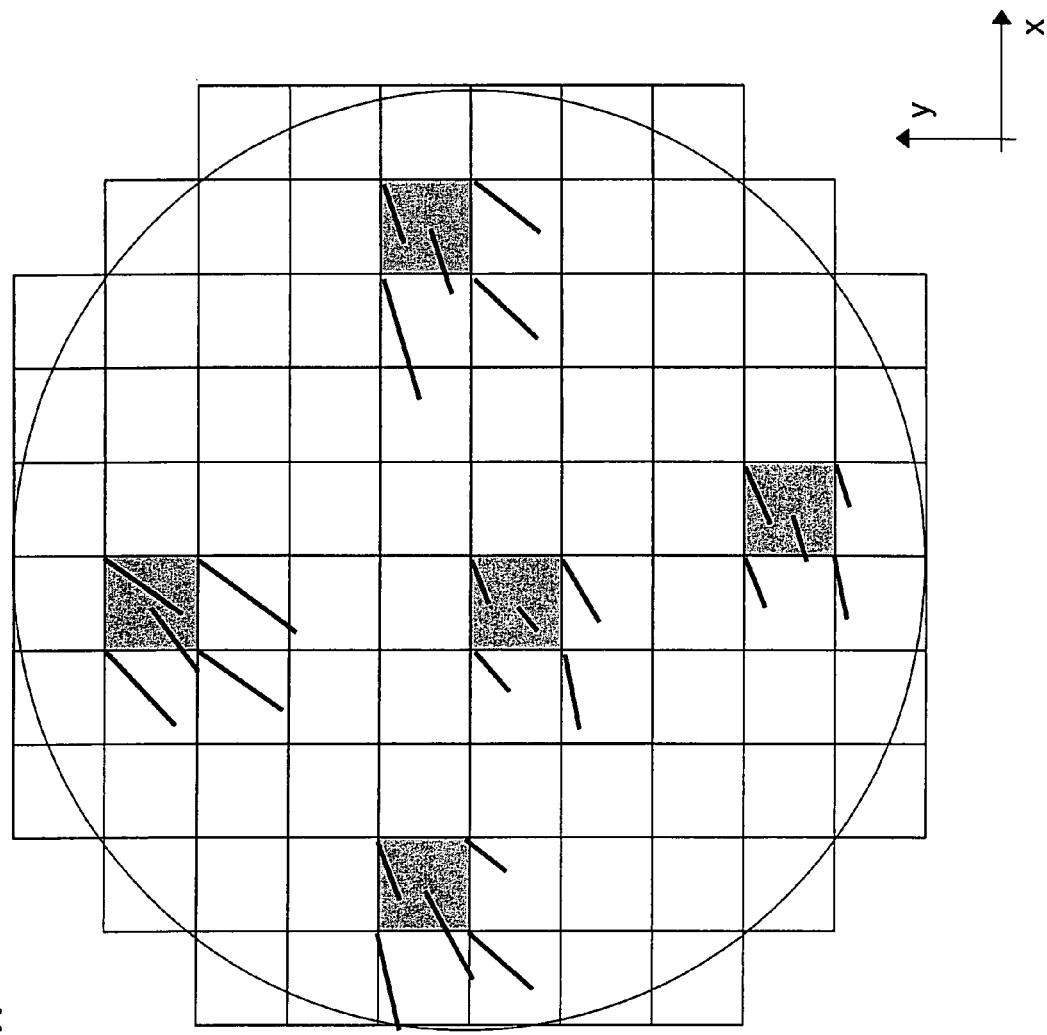
FIG. 5A is a vector-map and statistical analysis result showing overlay-offset.
Figure 5B:
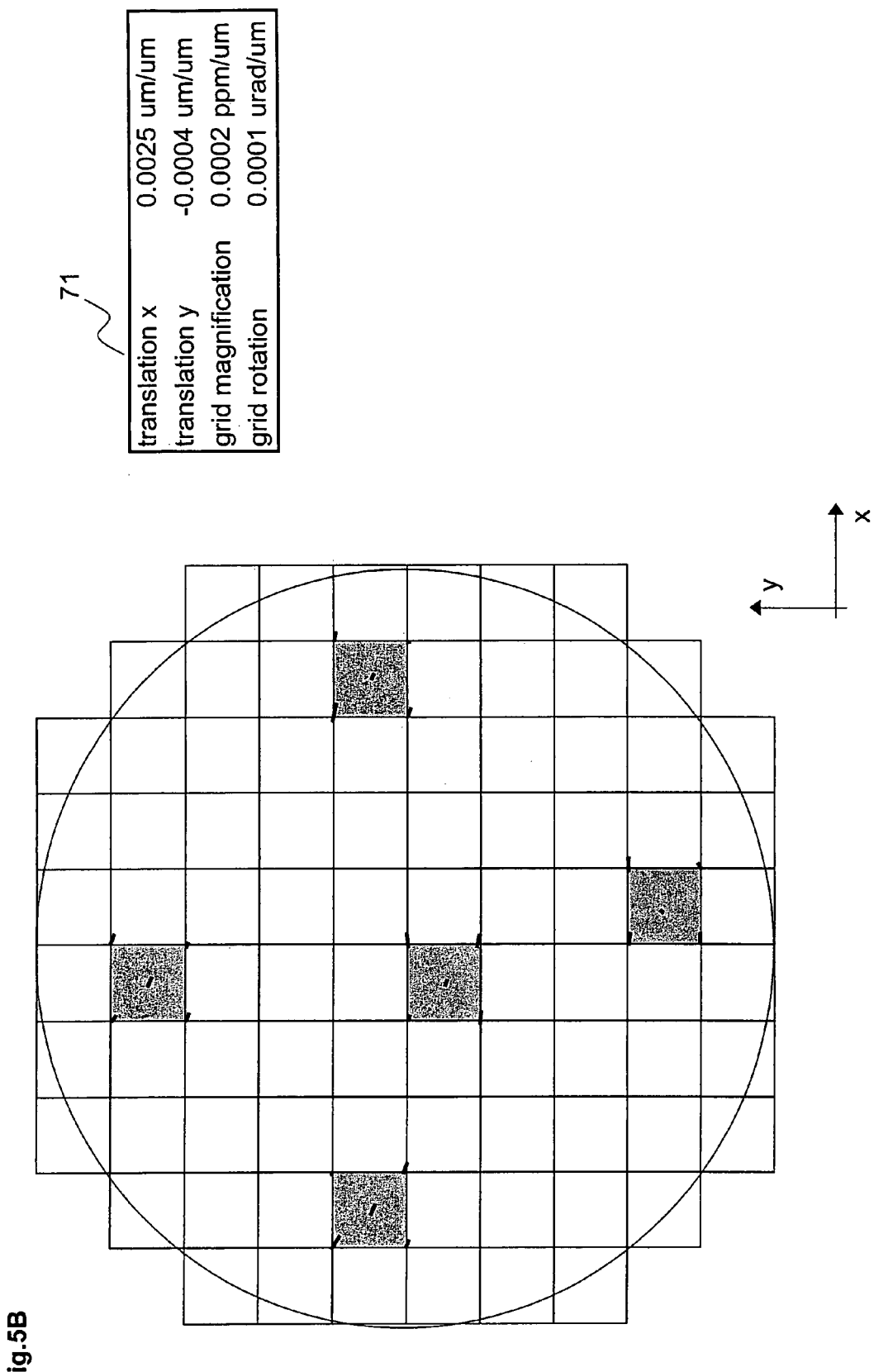
FIG. 5B is a vector-map and statistical analysis result showing TIS-through-focus.
Figure 5C:
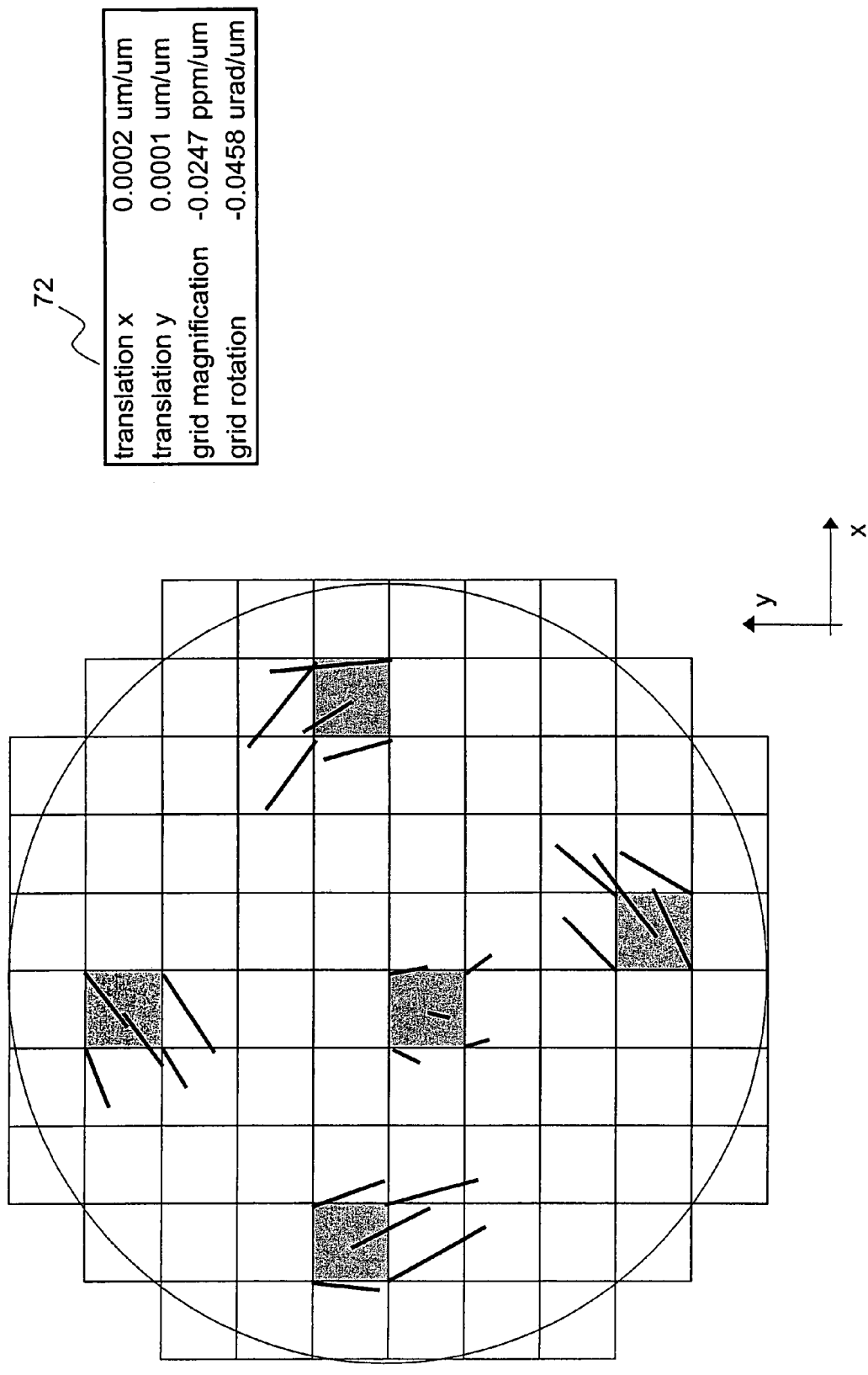
FIG. 5C is a vector-map and statistical analysis result showing TCV-through-focus.

A d/dz TIS vector-map analysis device 34, a d/dz TCV vector-map analysis device 35, and a TCV vector-map analysis device 36 analyze the d/dz TIS vector trend, the d/dz TCV vector trend, and the TCV vector trend, respectively. In addition, the d/dz TIS vector-map analysis device 34, the d/dz TCV vector-map analysis device 35, and the TCV vector-map analysis device 36 calculate some statistical parameters simultaneously. A display device 37 displays the vector maps and the results of the statistical analyses, as shown in FIGS. 5A-5C. These analyses and calculations are performed based on the coordinate values X and Y output by the X-Y positioning device 4. In particular, the TCV vector-map analysis device 36 calculates statistical parameters 70 (see FIG. 5A) using the same calculation procedure as in existing measurement apparatus, which solves parametric equations in terms of the parameters 70, the overlay-offset values, and the coordinate values X and Y. The statistical parameters 70 are fed back as the alignment error values in the photolithography process. Existing measurement apparatus, which only determine TIS and TCV at a single focus position (i.e., AF=0), determine and output a vector-map showing overlay-offset (i.e., TCV) and statistical parameters. Even if statistical parameters are only four parameters, as shown in FIGS. 5B-5C, the same simultaneous equations are used, substituting zero-value for the other four parameters. Thus, the vector-maps for TIS-through-focus and for TCV-through-focus can be determined using the existing hardware and software for vector-map generation, with different data (i.e., the data of the calculated TIS-through-focus and of the calculated TCV-through-focus, described herein) being provided to that vector-map generation hardware and software.

FIGS. 5A-5C show a TCV (overlay-offset) vector-map, a d/dz TIS (TIS-through-focus) vector map and a d/dz TCV (TCV-through-focus) vector-map, respectively, for a wafer processed according to a particular process (referred to as process (A)) displayed on the display device 37. The display device 37 also displays the results of parameters that were analyzed statistically, to the right side of the vector-map. Note that the dimensions of the statistical parameters of d/dz TIS and d/dz TCV are the original dimensions divided by micrometer, e.g., translation: μm/μm rotation: μrad/μm. The d/dz TIS and the d/dz TCV information reflects sensitivity to a change in focus as given by equation (3).

A higher NA (numerical aperture) of the objective lens 14 is not preferred, because it may be too sensitive for WIS, and may reduce the overlay measurement performance for a thick alignment mark. According to one preferred embodiment, NA of the objective lens 14 was 0.5.

Comparing FIG. 5B (TIS-through-focus) with FIG. 5C (TCV-through-focus), it can be seen that the d/dz TIS vectors of FIG. 5B show a negligible translational trend, but that the d/dz TCV vectors of FIG. 5C are much larger and show a rotational trend (in the counter-clockwise direction) and a magnification trend (i.e., the vectors are smaller toward the center of the wafer), and that the rotational component is larger than the magnification component. Therefore, the wafer that was processed according to process (A) is deemed to suffer from WIS, which includes a dominant rotational component and a smaller grid-magnification component. A user of the optical overlay deviation measurement apparatus can reach these conclusions by observing the displayed vector-maps of FIGS. 5B and 5C. It is easy to characterize WIS due to the different trends observed by comparing the d/dz TIS vector-map with the d/dz TCV vector-map. Typically, if TIS-through-focus is not stable, TIS changes linearly independent of an alignment mark location on the substrate because TIS is caused when the illumination light is not telecentric or when the optical system is not perpendicular to the substrate. In such a case, the d/dz TIS vector-map shows a translational trend but not a magnification or rotational trend. On the other hand, in the presence of WIS, the d/dz TCV vector-map of WIS would show a magnification trend or a rotational trend, but rarely shows a translational trend.

In order to achieve higher WIS characterization performance, a preferred embodiment includes a comparison device 80, shown schematically in FIG. 1. The comparison device 80 compares statistical parameters 71 of the d/dz TIS vector-map with statistical parameters 72 of the d/dz TCV vector-map. According to the results for some actual wafers, the apparatus of the present invention can measure about 1 nm difference by a 1 um changing of the Z-position, i.e., it can measure d/dz TIS value or d/dz TCV value=0.001 um/um. Therefore, the comparison device 80 determines a vector trend based on a criteria, based on whether the statistical parameter is more then 0.001 or not, at a first step. For instance, in the statistical parameters 71 shown in FIG. 5B, the d/dz TIS vector-map shows translation trend due to only translation X>0.001. In the statistical parameters 72 showing in FIG. 5C, the d/dz TCV vector-map shows grid magnification and grid rotation trend due to both parameters>0.001. The comparison device 80 compares the results of each trend, i.e., translation trend of d/dz TIS with magnification and rotation trend of d/dz TCV, at the second step. Thus, the comparison device 80 determines whether the substrate suffers from WIS automatically.

Figure 5D:
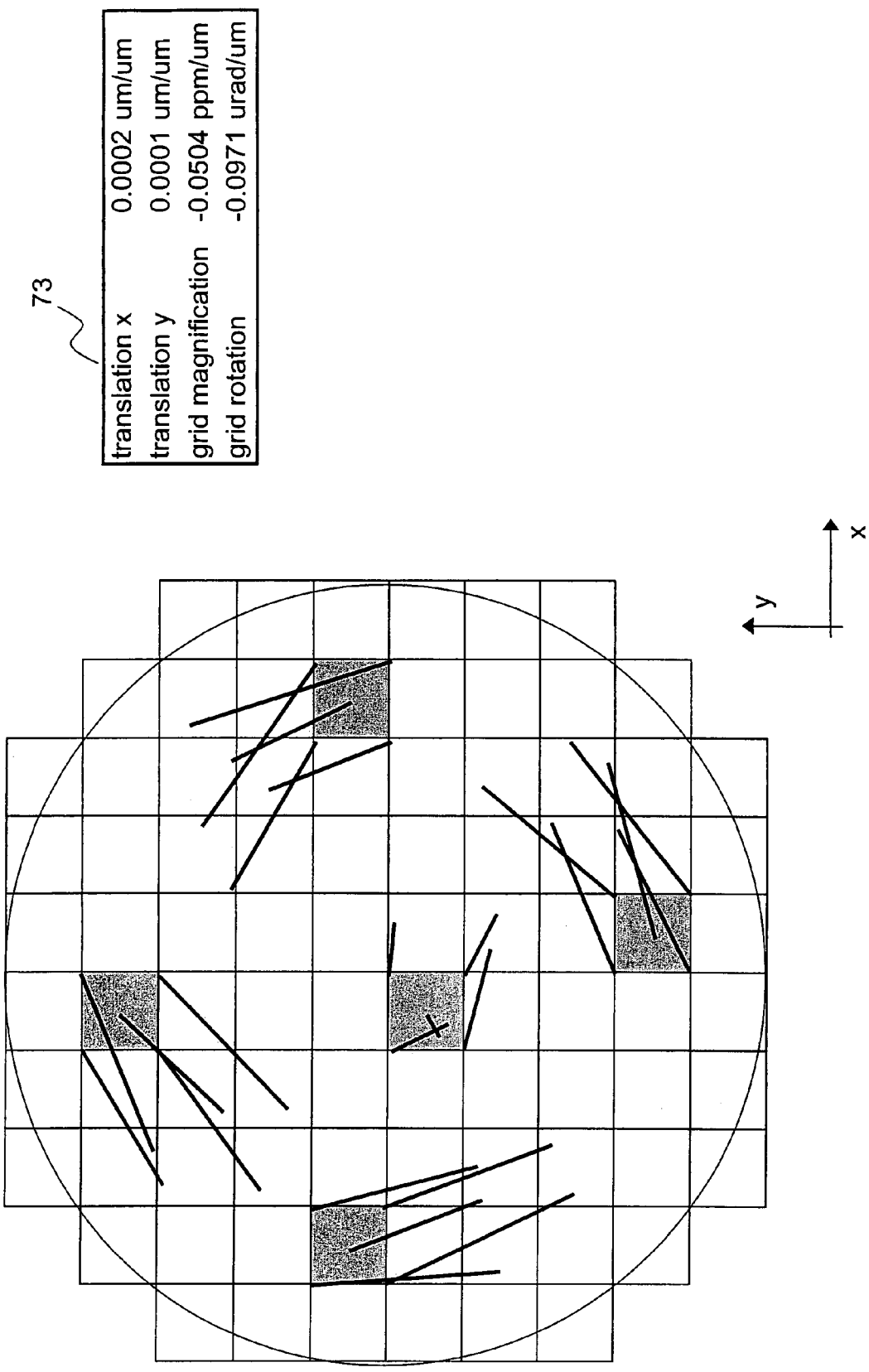
FIG. 5D is a vector-map and statistical analysis result showing TCV-through-focus for another wafer of a different lot.

According to the results for some actual process wafers analyzed by the present invention, it has been determined that rotational WIS exists in wafers mostly after they have been subjected to a CMP process, and that magnification WIS exists mostly in wafers after they have been subjected to a deposition process. A process condition could change unexpectedly, e.g., an over-polished CMP and a deposition target lifetime may change. The present invention provides a monitoring method to monitor WIS fluctuation caused by such process condition changes. By monitoring the wafers on a lot-by-lot basis, it is possible to observe that the d/dz TCV vectors increase in size, as shown in FIG. 5D, even if there is no change in the d/dz TIS vector-map. Actually, statistical parameters 73, i.e., grid magnification and grid rotation shown in FIG. 5D are twice larger than the statistical parameters 72. This means that a WIS trend has changed, and therefore it is advisable to measure the WIS value (for example, using AEI) so as to change the process conditions.

The following describes one example of application of the invention to a high-volume manufacturing line. As noted above, it is typical to measure TIS, and thus determine TCV for three wafers in each lot (for example, the first, tenth and twentieth wafers). According to one example of use of the invention, WIS is characterized for one wafer in each lot. For example, one of the wafers that is normally subjected to TIS measurement is measured at different focus positions in order to obtain the data that is used to calculate TIS-through-focus and TCV-through-focus. An example of the procedure is as follows:

1) Measure the first wafer of the three wafers that are to be measured in a lot at two Z-positions, for example, z=0 and z=+1.0 µm, by changing the Z-position of the wafer using the focus-moving device 5.

2) Measure the second and third wafers that are to be measured in the lot (as noted above, these actually may be the tenth and twentieth wafers in the lot) only at the z=0 position.

3) The TCV vector-map analysis device 36 analyzes the TCV vector trends and calculates the statistical parameters at the z=0 position for each of the three measured wafers. The display device 37 displays the vector-maps and the results of the statistical analysis for the three wafers, as is conventional.

4) The d/dz TIS calculation device 32 subtracts TIS (z=0) from TIS (z=+1 µm) for only the first measured wafer. The d/dz TCV calculation device 33 subtracts TCV (z=0) from TCV (z=+1.0 µm) for only the first measured wafer. The display device 37 displays the vector-maps for TIS-through focus and TCV-through-focus and the results of the statistical analyses for the first measured wafer.

Accordingly, a d/dz TCV vector-map is determined and displayed for one wafer in each lot so that an operator can monitor WIS on a lot-by-lot basis.

The differential values often are small (for example, 5 nm difference between z=0 and z=+1.0 µm). However, the apparatus of the invention can measure this small difference because the precision performance is less than 1 nm. Thus, according to steps (1)-(4), WIS monitoring is available concurrently with the regular overlay measurement, without requiring any additional structure other than the calculation devices.

As mentioned previously, the invention is applicable to the measurement of various types of substrates, not only wafers. The substrate can be a silicon wafer, a semiconductor wafer made from a material other than silicon, a glass substrate or a quartz substrate, for example.

In the illustrated embodiment, the various calculation devices (elements 23, 30-36 and 80 (if provided)) preferably are implemented using a suitably programmed general purpose computer, e.g., a microprocessor, microcontroller or other processor device (CPU or MPU). It will be appreciated by those skilled in the art, that the calculation devices also can be implemented as a single special purpose integrated circuit (e.g., ASIC) having a main or central processor section for overall, system-level control, and separate sections dedicated to performing various different specific computations, functions and other processes under control of the central processor section. The calculation devices (which also can be referred to as a controller) also can be implemented using a plurality of separate dedicated or programmable integrated or other electronic circuits or devices (e.g., hardwired electronic or logic circuits such as discrete element circuits, or programmable logic devices such as PLDs, PLAs, PALs or the like). The controller also can be implemented using a suitably programmed general purpose computer in conjunction with one or more peripheral (e.g., integrated circuit) data and signal processing devices. In general, any device or assembly of devices on which a finite state machine capable of implementing the described procedures can be used as the calculation devices/controller of the invention.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. An overlay measurement apparatus capable of monitoring wafer induced shift (WIS), the apparatus comprising a processor that:

calculates tool induced shift (TIS) values at a plurality of focus positions of a substrate as the substrate moves in a first direction substantially perpendicular to a top surface of the substrate;

calculates a TIS corrected value (TCV) for each TIS value;

calculates a first value representing changes in TIS with respect to changes in focus position;

calculates a second value representing changes in TCV with respect to changes in focus position; and generates an output from the first value and the second value, the output enabling a determination of whether WIS is present.

2. The apparatus of claim 1, wherein the processor generates the output by generating a first vector map from the first value and generating a second vector map from the second value, the apparatus further comprising a display that displays the first vector map and the second vector map to enable a user to determine whether WIS is present.

3. The apparatus of claim 1, wherein the output comprises a first vector map generated from the first value and a second vector map generated from the second value, the apparatus further comprising a comparator that compares statistical parameters of the first vector map and the second vector map to determine whether WIS is present.

4. A system that evaluates wafer induced shift, the system comprising:
    a stage that supports a specimen, the stage being movable in a first direction perpendicular to a surface of the specimen;
    a measurement device coupled to the stage, the measurement device comprising:
        an illumination system that directs energy toward an upper surface of the specimen; and
        an image-forming system that detects energy propagating from the upper surface of the specimen, wherein the measurement device generates one or more output signals in response to the detected energy;
    a processor coupled to the measurement device, the processor:
        calculates tool-induced-shift (TIS) values from the output signals at a plurality of focus positions as the specimen moves in the first direction;
        calculates a TIS corrected value (TCV) for each TIS value;
        generates a first output representing changes in TIS values with respect to changes in focus position of the specimen; and
        generates a second output representing changes in TCVs with respect to changes in focus position of the specimen; and
    a display for displaying the first output and the second output to enable a user to determine a presence of wafer induced shift.

5. The system of claim 4, further comprising an automatic focusing device that determines a zero-position when the stage changes position in the first direction.

6. The system of claim 4, wherein the stage is rotatable about an axis in the first direction.

7. The system of claim 4, wherein the first output comprises a first vector map and the second output comprises a second vector map.

8. The system of claim 4, further comprising a comparator that compares statistical parameters of the first output with statistical parameters of the second output to determine the presence of wafer induced shift.

9. A method for evaluating wafer induced shift, the method comprising:
    calculating tool induced shift (TIS) values at a plurality of focus positions of a substrate as the substrate moves in a first direction substantially perpendicular to a top surface of the substrate;
    calculating a TIS corrected value (TCV) for each TIS value;
    generating a first vector map representing changes in TIS values with respect to changes in focus position;
    generating a second vector map representing changes in TCVs with respect to changes in focus position; and
    displaying the first vector map and the second vector map to enable a user to determine the presence of wafer induced shift.

10. A computer-implemented method for controlling a system that evaluates wafer induced shift, the method comprising:
    calculating tool induced shift (TIS) values at a plurality of focus positions of a substrate as the substrate moves in a first direction substantially perpendicular to a top surface of the substrate;
    calculating a TIS corrected value (TCV) for each TIS value;
    generating a first vector map representing changes in TIS values with respect to changes in focus position;
    generating a second vector map representing changes in TCVs with respect to changes in focus position;
    comparing parameters of the first vector map with corresponding parameters of the second vector map to generate an output; and
    displaying the output.

* * * * *

UNITED STATES PATENT AND TRADEMARK OFFICE
CERTIFICATE OF CORRECTION

PATENT NO.         : 7,362,436 B2
APPLICATION NO.    : 11/785003
DATED              : April 22, 2008
INVENTOR(S)        : Fuminori Hayano It is certified that error appears in the above-identified patent and that said Letters Patent is hereby corrected as shown below:

Title Page

Please delete the following:

(75) Inventor:   Fujimori Hayano, Phoenix, AZ (US)

and Replace with:

(75) Inventor:   Fuminori Hayano, Phoenix, AZ (US)

Signed and Sealed this

Twenty-ninth Day of July, 2008

JON W. DUDAS
*Director of the United States Patent and Trademark Office*